United States Patent
Yoder et al.

(10) Patent No.: US 7,965,503 B2
(45) Date of Patent: Jun. 21, 2011

(54) FAN AND STORAGE DEVICE MOUNTING ASSEMBLY FOR ELECRONIC DEVICE

(75) Inventors: Mark Alan Yoder, Carmel, IN (US); Brian Michael Scally, Jamestown, IN (US)

(73) Assignee: Thomson Licensing, Boulogne-Billancourt (FR)

( * ) Notice: Subject to any disclaimer, the term of this patent is extended or adjusted under 35 U.S.C. 154(b) by 0 days.

(21) Appl. No.: 12/451,867

(22) PCT Filed: Jun. 27, 2007

(86) PCT No.: PCT/US2007/014962
§ 371 (c)(1),
(2), (4) Date: Dec. 3, 2009

(87) PCT Pub. No.: WO2009/005490
PCT Pub. Date: Jan. 8, 2009

(65) Prior Publication Data
US 2010/0103615 A1    Apr. 29, 2010

(51) Int. Cl.
*H05K 7/20* (2006.01)
(52) U.S. Cl. .............. 361/692; 361/679.51; 361/679.33; 361/679.48; 361/695; 165/121; 165/122; 454/184
(58) Field of Classification Search ............. 361/679.33, 361/679.36, 679.46–5, 690–695; 165/80.3, 165/104.33, 121, 126, 185; 312/223.2, 223.3; 174/16.3, 252
See application file for complete search history.

(56) References Cited

U.S. PATENT DOCUMENTS

| | | | | |
|---|---|---|---|---|
| 4,926,291 A * | 5/1990 | Sarraf | ...... | 361/679.36 |
| 5,224,024 A * | 6/1993 | Tu et al. | ...... | 361/831 |
| 5,269,598 A * | 12/1993 | Liu | ...... | 312/223.2 |
| 5,398,161 A * | 3/1995 | Roy | ...... | 361/727 |
| 5,510,954 A | 4/1996 | Wyler | | |
| 5,511,055 A * | 4/1996 | Otsuki et al. | ...... | 720/649 |
| 5,831,847 A * | 11/1998 | Love | ...... | 363/141 |
| 5,927,386 A | 7/1999 | Lin | | |
| 6,005,770 A * | 12/1999 | Schmitt | ...... | 361/695 |
| 6,301,105 B2 | 10/2001 | Glorioso et al. | | |
| 6,473,297 B1 | 10/2002 | Behl et al. | | |
| 6,618,248 B1 * | 9/2003 | Dalheimer | ...... | 361/679.33 |
| 6,795,314 B1 * | 9/2004 | Arbogast et al. | ...... | 361/695 |
| 6,914,779 B2 * | 7/2005 | Askeland et al. | ...... | 361/679.51 |

(Continued)

FOREIGN PATENT DOCUMENTS

DE    202005010511 U1 * 12/2005

(Continued)

OTHER PUBLICATIONS

International Search Report, dated Aug. 4, 2008.

*Primary Examiner* — Michael V Datskovskiy
(74) *Attorney, Agent, or Firm* — Robert D. Shedd; Harvey D. Fried; Richard LaPeruta

(57) ABSTRACT

A fan [36] and storage device [37] mounting assembly [1] for an electronic device comprises a base [2] having opposing front [4] and rear [5] walls. The rear wall [5] has a plurality of ventilation openings [11] provided therein. A support [16] has a fan [36] mount [32] arranged adjacent to the front wall [4] and substantially perpendicular thereto and a storage device [37] receiving opening [20] arranged between the fan mount [32] and the ventilation openings [11].

17 Claims, 3 Drawing Sheets

U.S. PATENT DOCUMENTS

| | | |
|---|---|---|
| 6,958,909 B2 | 10/2005 | Endo et al. |
| 7,068,498 B2 * | 6/2006 | Bolich et al. .................. 361/752 |
| 7,068,505 B2 * | 6/2006 | Kosugi .......................... 361/690 |
| 7,209,352 B2 * | 4/2007 | Chen ............................. 361/695 |
| 7,307,843 B2 * | 12/2007 | Harman et al. ............... 361/719 |
| 7,315,445 B2 * | 1/2008 | Kirby et al. .............. 361/679.33 |
| 7,369,406 B2 * | 5/2008 | Matsushima et al. ......... 361/695 |
| 7,403,385 B2 * | 7/2008 | Boone et al. .................. 361/692 |
| 2002/0051338 A1 | 5/2002 | Jiang et al. |
| 2005/0168929 A1 * | 8/2005 | Inoue et al. ................... 361/683 |
| 2007/0125523 A1 * | 6/2007 | Bhatti et al. ............. 165/104.33 |

FOREIGN PATENT DOCUMENTS

JP            4-4094195 A * 3/1992

* cited by examiner

FAN AND STORAGE DEVICE MOUNTING ASSEMBLY FOR ELECRONIC DEVICE

This application claims the benefit, under 35 U.S.C. §365 of International Application PCT/US2007/14962, filed Jun. 27, 2007 which was published in accordance with PCT Article 21(2) on Jan. 8, 2009 in English.

FIELD OF THE INVENTION

The present invention relates to a fan and storage device mounting assembly for an electronic device comprising a base having a plurality of ventilation openings provided therein and a support having a fan mount and a storage device receiving opening arranged between the fan mount and the ventilation openings.

BACKGROUND

Electronic devices, such as digital video recorders, use a storage device, such as a hard disk drive, to store information, such as television programming and other multimedia content. In order to maintain a long life expectancy of the storage device, strict limits are placed on operating temperatures of the electronic device. A fan is therefore provided in the electronic device to keep the electronic device at acceptable operating temperatures. However, both the fan and the storage device create a great deal of undesired noise during operation, which is capable of being heard by users of the electronic device. This noise may be generated, for example, from vibrations from the motion of the fan and from air passing through ventilation openings in the electronic device. Additionally, if the fan is mounted on an exterior wall of the electronic device, when the air is blown out of the ventilation openings in the electronic device by the fan, which is the most effective method of cooling the electronic device, the noise from the air passing through the ventilation openings is louder than when the air is drawn into the electronic device by the fan. As a result, there is a need to develop an electronic device wherein undesired noise during operation is kept at a minimum while maintaining acceptable operating temperatures.

BRIEF SUMMARY

A fan and storage device mounting assembly for an electronic device comprises a base having opposing front and rear walls. The rear wall has a plurality of ventilation openings provided therein. A support has a fan mount arranged adjacent to the front wall and substantially perpendicular thereto and a storage device receiving opening arranged between the fan mount and the ventilation openings.

DETAILED DESCRIPTION OF THE EMBODIMENT(S)

Figure 1:
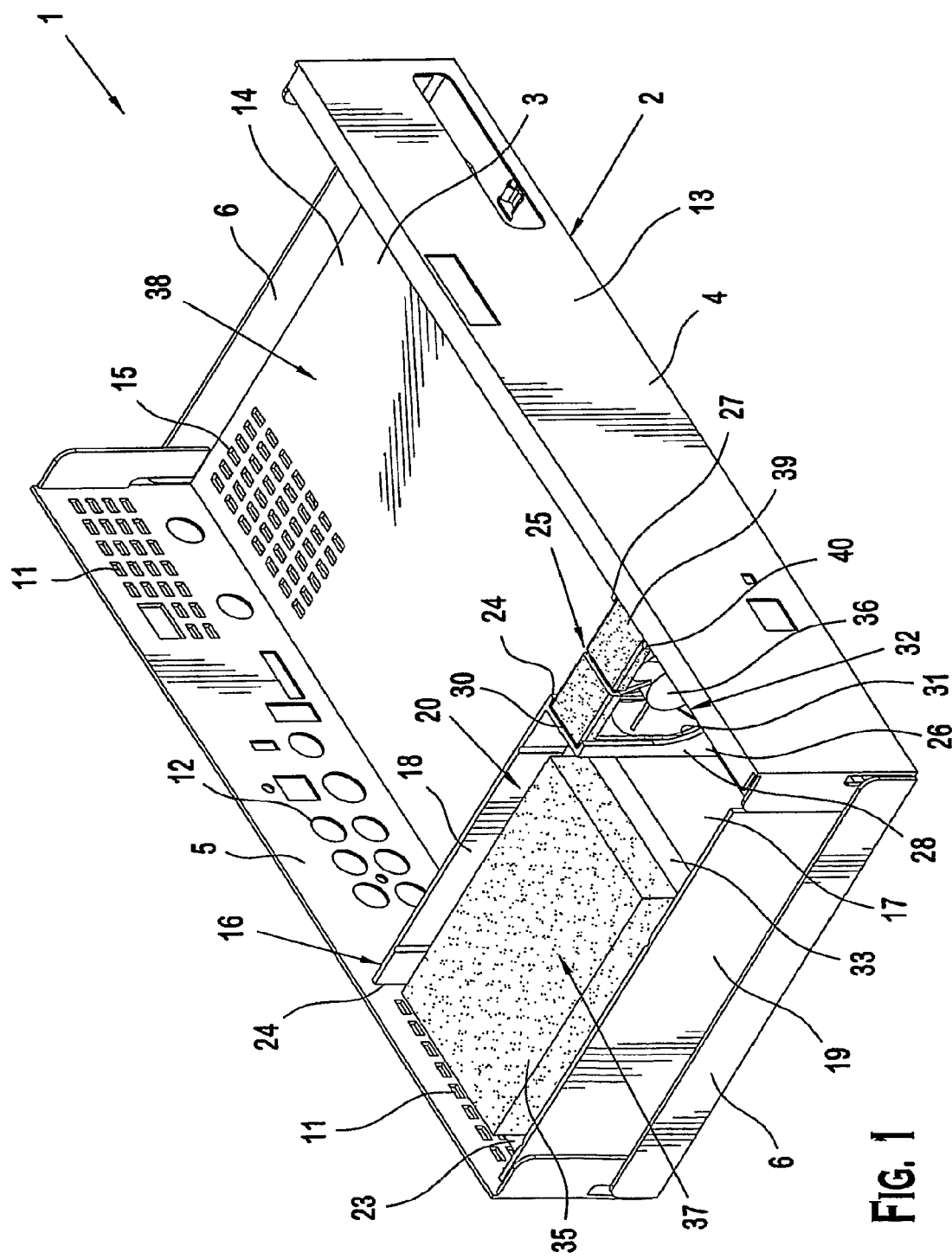
FIG. 1 is a perspective view of a fan and storage device assembly for an electronic device according to the invention.
Figure 3:
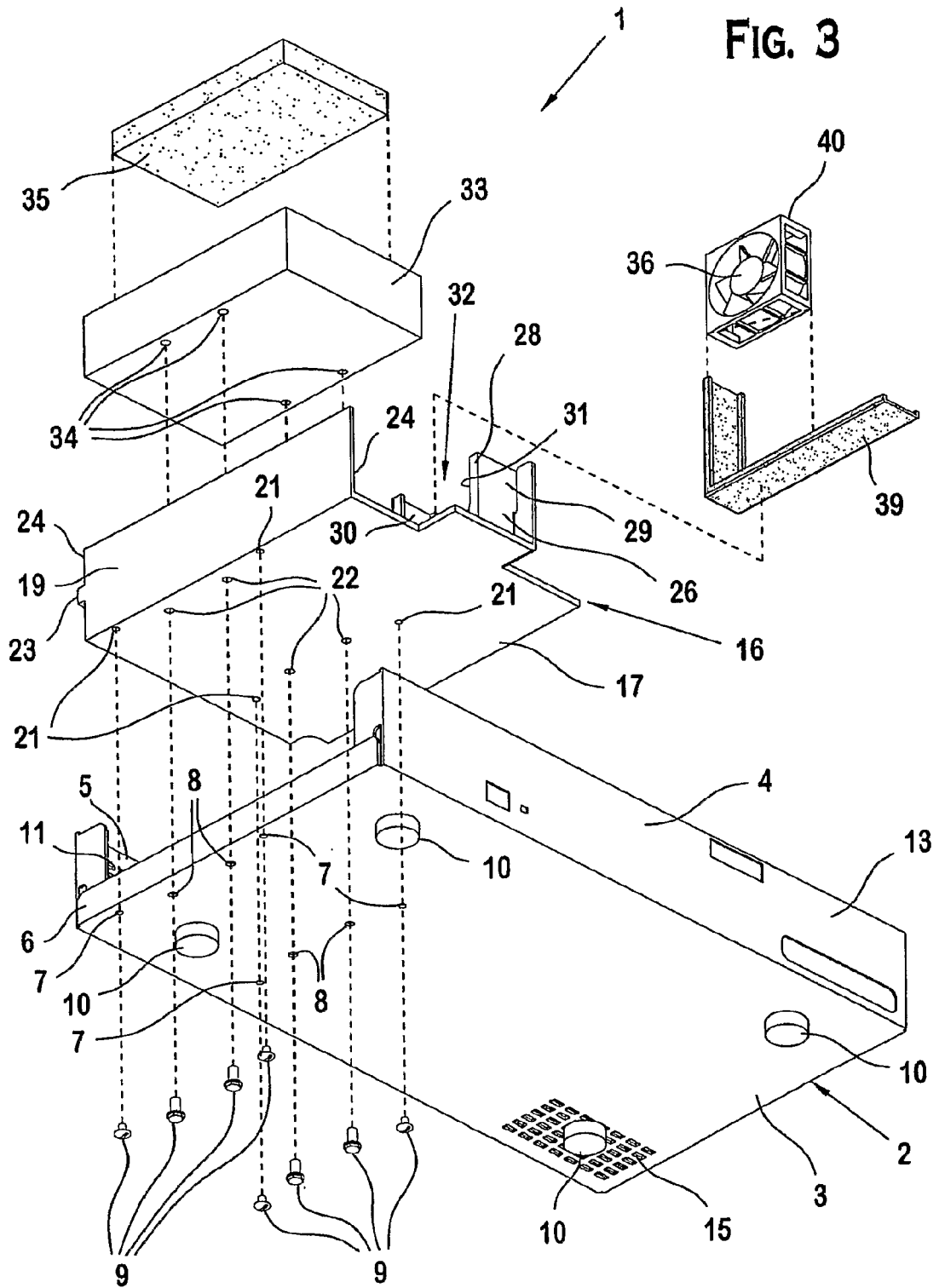
FIG. 3 is an exploded view of the fan and storage device assembly of FIG. 1.

FIG. 1 shows a fan and storage device assembly 1 for an electronic device according to the invention. As shown in FIGS. 1 and 3, the fan and storage device assembly 1 includes a base 2. The base 2 is a substantially rectangular frame having a bottom wall 3, a front wall 4, a rear wall 5, and side walls 6. As shown in FIG. 3, the bottom wall 3 is provided with a plurality of support mounting apertures 7 and storage device mounting apertures 8. The support mounting apertures 7 and the storage device mounting apertures 8 extend from an outside surface 13 to an inside surface 14 of the base 2 and are configured for receipt of attachment members 9, such as grommets or screws. The attachment members 9 may be made, for example, from a plastic, metal, or rubber material. Support members 10 extend from the outside surface 13 of the bottom wall 3 of the base 2. The support members 10 may be made for example, from a plastic or rubber material.

As shown in FIGS. 1 and 3, the front wall 4, the rear wall 5, and the side walls 6 extend upward from the base 2 and substantially perpendicular thereto. A plurality of ventilation openings 11 and a plurality of component receiving openings 12 are provided in the rear wall 5. The ventilation openings 11 component receiving openings 12 extend from the outside surface 13 to the inside surface 14 of the base 2. The ventilation openings 11 are provided in the rear wall 5 proximate the side walls 6. Additional ventilation openings 15 may be formed in the bottom wall 3 of the base 2 adjacent to the ventilation openings 11. The base 2 may be, for example, stamped and formed from a metal sheet or molded from a plastic material.

Figure 2:
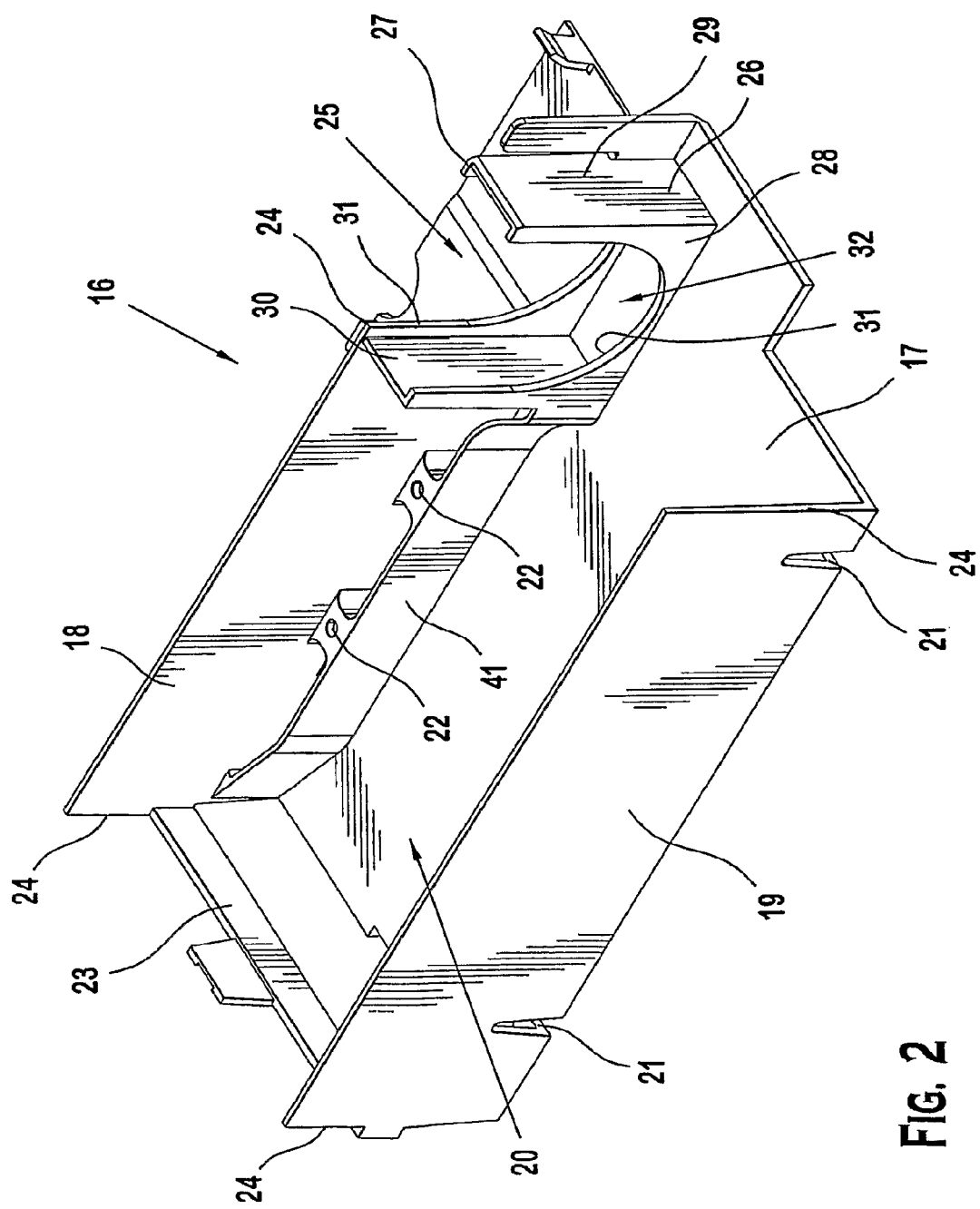
FIG. 2 is a perspective view of a support of the fan and storage device assembly of FIG. 1.

As shown in FIG. 1, a support 16 is mounted to the inside surface 14 of the base 2. As shown in FIG. 2, the support 16 is a substantially rectangular frame having a bottom support wall 17 and opposing first and second support walls 18, 19, respectively. The bottom support wall 17 is configured to extend substantially between the front and rear walls 4, 5 of the base 2. Base mounting apertures 21 aligning with the support mounting apertures 7 in the base 2 and storage device mounting apertures 22 aligned with the storage device mounting apertures 8 in the base 2 are provided in the bottom support wall 17.

The first and second support walls 18, 19 extend upward from the bottom support wall 17 and substantially perpendicular thereto. The first and second support walls 18, 19 extend substantially between the front and rear walls 4, 5 of the base 2 and substantially parallel to the side walls 6 of the base 2. The first support wall 18 is either configured to be shorter in a direction of length than the second support wall 19 or is provided with an opening therein to form a fan opening 25 adjacent to the front wall 4 of the base 2. The first and second support walls 18, 19 are configured such that a storage device receiving opening 20 is formed therebetween. Storage device support shoulders 41 may be formed in the storage device receiving opening 20 and may be formed to extend upward from the bottom support wall 17 and outward from the first and second support walls 18, 19. A spacer 23 extends between the first and second support walls 18, 19 on a side of the support 16 opposite from the fan opening 25 and is provided on the outer sides 24 of the first and second support walls 18, 19.

As shown in FIG. 2, a fan mount 26 is provided on the support 16 adjacent to the fan opening 25 and the storage device receiving opening 20. The fan mount 26 extends substantially parallel to the first support wall 18 and has a front surface 27, a rear surface 28, and first and second side surfaces 29, 30, respectively. The front surface 27 and the rear surface 28 extend substantially parallel to the first support wall 18 and are provided with openings 31 therein. The front surface 27 is arranged such that the front surface 27 forms a substantially continuous plane with the first support wall 18 and may be integrally formed therewith. The first and second side surfaces 29, 30 extend substantially perpendicular to the first support wall 18. The front surface 27, the rear surface 28, and the first and second side surfaces 29, 30 form a fan receiving pocket 32. The support 16 may be, for example, injection molded from a plastic material, a high-impact polystyrene (HIPS), an acrylonitrile butadiene styrene (ABS), or any other material that is easily moldable and has high noise damping characteristics, low vibration transfer, and/or flame retardance.

As shown in FIG. 1, a storage device 33 is mounted in the support 16 between the first and second support walls 18, 19 in the storage device receiving opening 20. The storage device 33 may be, for example, a non-volatile storage device such as, a hard disk drive, optical disk drive, etc. As shown in FIG. 3, mounting apertures 34 aligned with the storage device mounting apertures 22 in the support 16 and the storage device mounting apertures 8 in the base 2 are provided in a surface of the storage device 33 facing the bottom support wall 17 of the support 16. A damper 35 is provided on a surface of the storage device 33 opposite from the bottom support wall 17 of the support 16. The damper 35 may be, for example, a piece of low rebound foam.

As shown in FIG. 1, a fan 36 contained in a housing 40 is mounted in the fan receiving pocket 32 substantially parallel to the first support wall 18 of the support 16. The fan 36 is mounted in the fan receiving pocket 32 such that during operation airflow is drawn from a low pressure side 37 of the fan and storage device assembly 1 to a high pressure side 38 of the fan and storage device assembly 1. The fan 36 is well known in the art and therefore further description thereof has been omitted. A fan damper 39 is wrapped or otherwise provided on an outside surface of the housing 40 of the fan 36 so that the fan damper 39 substantially lines the fan receiving pocket 32 when the fan 36 is inserted therein. Alternatively, the fan damper 39 could be provided in the fan pocket 32 such that the fan damper 39 substantially lines the fan pocket 32 prior to insertion of the fan 36 therein. The fan damper 39 may be, for example, a piece of high rebound, low density foam.

The assembly of the fan and storage device assembly 1 will now be described. The fan and storage device assembly 1 may be used, for example, in an electronic device, such as a digital video recorder. As shown in FIG. 1, the support 16 is positioned in the inside surface 14 of the base 2 such that the spacer is positioned adjacent to the ventilation opening 11 in the front wall 4 of the base 2 and the fan mount 26 is positioned adjacent to the front wall 75 of the base 2. The first support wall 18 thereby divides the fan and storage device mounting assembly 1 in an approximate center of the base 2. The bottom support wall 17 of the support 16 is positioned in the inside surface 14 of the base 2 adjacent to the bottom wall 3 such that the base mounting apertures 21 align with the support mounting apertures 7. Attachment members 9 are inserted through the support mounting apertures 7 and into the base mounting apertures 21 from an outside surface 13 of the base 2 and attach the support 16 to the base 2.

The storage device 33 is positioned in the storage device receiving opening 20 adjacent to the bottom support wall 17 of the support 2 and between the first support wall 18, the second support wall 19, the spacer 23, and the second side surface 30 of the fan mount 26. The mounting apertures 34 of the storage device 33 are aligned with the storage device mounting apertures 22 of the support 16 and the storage device mounting apertures 8 of the base 2. Attachment members 9 are inserted through the storage device mounting apertures 8 of the base 2 and the storage device mounting apertures 22 of the support 16 and into the mounting apertures 34 of the storage device 33 from an outside surface 13 of the base 2 and attach the storage device 33 to the base 2. The damper 35 is then provided on the surface of the storage device 33 opposite from the bottom support wall 17 of the support 16.

As shown in FIG. 1, the fan damper 39 is wrapped or otherwise provided on the outside surface of the housing 40 of the fan 36. The fan 36 is then mounted in the fan receiving pocket 32 such that the fan damper 39 is arranged between the housing 40 and the fan mount 26. The fan 36 is arranged substantially parallel to the first support wall 18 of the support 16. The fan 36 is mounted in the fan receiving pocket 32 such that during operation airflow is drawn from the low pressure side 37 of the fan and storage device assembly 1 to the high pressure side 38 of the fan and storage device assembly 1. Although the low pressure side 37 is illustrated as being on a side of the storage device 35 and the high pressure side 38 is illustrated as being on a side opposite the side of the storage device 35, it will be appreciated by those skilled in the art that alternatively the high pressure side may be on the side of the storage device 35 and the low pressure side may be on the side opposite the side of the storage device 35 by reversing the direction of airflow with the fan 36.

During operation of the fan and storage device assembly 1, the fan 36 draws air from the low pressure side 37 of the fan and storage device assembly 1 to the high pressure side 38 of the fan and storage device assembly 1. Because the first support wall 18 divides the fan and storage device assembly 1 into the low pressure side 37 and the high pressure side 38, air is drawn across all sides of the storage device 33 thereby creating adequate cooling thereof. Additionally, because the fan 36 is mounted on a side of the base 2 farthest from the ventilation openings 11 and additional ventilation openings 15, very little noise is emitted from the fan and storage device assembly 1 by the operation of the fan 36. Further, because the fan mount 36 is lined with the fan damper 39, the housing 40 of the fan 36 is prevented from making hard contact with the fan mount 26 thereby preventing vibration noise. Also, the support 16 surrounds the storage device 33 on at least three sides and the storage device 33 is covered with the damper 35, which provides additionally damping for noise emitted from the fan and storage device assembly 1. Finally, the storage device 33 is capable of being mounted to the base from the outside surface 13 of the base 2, which simplifies the assembly and disassembly of the storage device 33 from the base 2. The fan and storage device assembly 1 according to the present invention thereby reduces undesired noise during operation while maintaining acceptable operating temperatures.

In a preferred embodiment, the invention is a storage device mounting assembly 1 comprising a rectangular frame (or base 2) having opposing front and rear walls 4, 5 and opposing first and second walls 6, where the walls extend vertically from a bottom wall 3. A vertical support plate 16 extends from the rear wall toward the front wall. The fan 36 is supported by the plate, parallel therewith, and positioned closer to the front wall than the rear wall, wherein the fan and plate create a low pressure side 37 between the first wall and the plate and create a high pressure side 38 between the second wall and the plate. The electronic device (or storage device 35) is on the low pressure side positioned toward the rear wall such that the fan is not directly facing any portion of the electronic device. A plurality of ventilation openings are positioned on the rear wall 11 and/or the bottom 3 on the high pressure side, wherein each of these openings is nearer to the second wall than the plate, each of these openings is nearer the rear wall than the front wall, and each of these openings is positioned toward the rear wall such that the fan is not directly facing any of these openings.

In another preferred embodiment, the invention can be described as an apparatus or assembly 1 comprising an enclosure having exterior walls defining an interior space. At least one interior wall divides the interior space into first and second compartments. The first compartment has mounted therein a heat generating device requiring active cooling during operation. A fan assembly forms a part of the at least one interior wall. At least one of the exterior walls bounds the first compartment which has a first set of apertures. At least one of the exterior walls bounds the second compartment which has a second set of apertures spaced from the fan assembly. The first and second sets of apertures and the fan assembly define an air flow path inside the enclosure and through the at least one interior wall for cooling the heat generating device. The heat generating device is disposed between the first set of apertures and the fan assembly. The fan assembly is spaced from both the first and second sets of apertures. The fan assembly can be adjacent to one end of the heat generating device. The first compartment can be disposed at a first end of the enclosure and the second set of apertures can be disposed adjacent a second end of the enclosure opposite the first end. Further, the first compartment can be disposed at a first end of the enclosure and the second set of apertures is disposed adjacent a second end of the enclosure opposite the first end. A third compartment can be disposed at one end of the first compartment and formed by portions of at least four of the exterior walls bounding the first compartment, the fan assembly, and one end of the heat generating device. The third compartment can be further disposed at one interior corner of the enclosure. The third compartment can also be disposed at one end of the first compartment and formed by portions of at least four of the exterior walls bounding the first compartment, the fan assembly, and the one end of the heat generating device, wherein the fan assembly is adjacent to one end of the heat generating device and the third compartment can be further disposed at one interior corner of the enclosure. The apparatus can even comprise a third compartment being disposed at one end of the first compartment and bounded in part by portions of the exterior walls and the fan assembly, wherein the portions of the exterior walls bounding the third compartment prevent air moving along the flow path from entering or leaving the enclosure.

The foregoing illustrates some of the possibilities for practicing the invention. Many other embodiments are possible within the scope and spirit of the invention. It is, therefore, intended that the foregoing description be regarded as illustrative rather than limiting, and that the scope of the invention is given by the appended claims together with their full range of equivalents.

The invention claimed is:

1. An electronic device, comprising:
    a base having opposing front and rear walls, the rear wall having a plurality of ventilation openings provided therein; and
    a support having a fan mount arranged adjacent to the front wall and substantially perpendicular thereto and a storage device receiving opening arranged between the fan mount and the ventilation openings.

2. The electronic device of claim 1, wherein the support is made from an injection molded plastic material.

3. The electronic device of claim 1, wherein the fan mount includes a fan receiving pocket, the fan receiving pocket being lined with a fan damper.

4. The electronic device of claim 3, wherein the fan damper is a foam material.

5. The electronic device of claim 1, wherein the support includes a first support wall that forms a substantially continuous plane with a front surface of the fan mount, the first support wall dividing the fan and storage device mounting assembly into a low pressure side and a high pressure side.

6. The electronic device of claim 5, wherein the first support wall divides the fan and storage device mounting assembly into a low pressure side and a high pressure side in an approximate center of the base.

7. The electronic device of claim 1, wherein the storage device receiving opening is defined by a bottom support wall and opposing first and second support walls.

8. The electronic device of claim 7, wherein a damper is provided in the storage device receiving opening.

9. The electronic device of claim 1, wherein storage device mounting apertures extend from an outside surface of the base into the storage device receiving opening and receive attachment members for mounting a storage device to the base.

10. A storage device mounting assembly comprising:
    a rectangular frame having opposing front and rear walls and opposing first and second walls, the walls extending vertically from a bottom wall;
    a vertical support plate, the plate extending from the rear wall toward the front wall;
    a fan being supported by the plate, parallel therewith, and positioned closer to the front wall than the rear wall, wherein the fan and plate create a low pressure side between the first wall and the plate and create a high pressure side between the second wall and the plate;
    an electronic device in the low pressure side positioned toward the rear wall such that the fan is not directly facing any portion of the electronic device; and,
    a plurality of ventilation openings in the high pressure side, wherein each of the openings in the high pressure side being nearer to the second wall than the plate, each of the openings in the high pressure side being nearer the rear wall than the front wall, and each of the openings in the high pressure side positioned toward the rear wall such that the fan is not directly facing any of the openings in the high pressure side.

11. An apparatus, comprising:
    an enclosure having exterior walls defining an interior space;
    at least one interior wall dividing said interior space into first and second compartments, said first compartment having mounted therein a heat generating device requiring active cooling during operation;
    a fan assembly forming a part of said at least one interior wall;
    at least one of said exterior walls bounding said first compartment having a first set of apertures;
    at least one of said exterior walls bounding said second compartment having a second set of apertures spaced from said fan assembly;
    said first and second sets of apertures and said fan assembly defining an air flow path inside said enclosure and through said at least one interior wall for cooling said heat generating device; and,
    said heat generating device being disposed between said first set of apertures and said fan assembly, said fan assembly being spaced from both said first and second sets of apertures, wherein said apparatus further comprising: a third compartment disposed at one end of said first compartment and bounded in part by portions of said exterior walls and said fan assembly; and, said portions of said exterior walls bounding said third compartment preventing air moving along said flow path from entering or leaving said enclosure.

12. The apparatus of claim 11, wherein said fan assembly is adjacent to one end of said heat generating device.

13. The apparatus of claim 12, wherein said first compartment is disposed at a first end of said enclosure and said second set of apertures is disposed adjacent a second end of said enclosure opposite said first end.

14. The apparatus of claim 11, wherein said first compartment is disposed at a first end of said enclosure and said second set of apertures is disposed adjacent a second end of said enclosure opposite said first end.

15. The apparatus of claim 11, wherein said third compartment is further disposed at one interior corner of said enclosure.

16. The apparatus of claim 12, wherein the third compartment is formed by:
   portions of at least four of said exterior walls bounding said first compartment;
   said fan assembly; and,
   said one end of said heat generating device.

17. The apparatus of claim 16, wherein said third compartment is further disposed at one interior corner of said enclosure.

* * * * *